US007800185B2

(12) United States Patent
Hshieh (10) Patent No.: US 7,800,185 B2
(45) Date of Patent: Sep. 21, 2010

(54) CLOSED TRENCH MOSFET WITH FLOATING TRENCH RINGS AS TERMINATION

(75) Inventor: Fwu-Iuan Hshieh, Saratoga, CA (US)

(73) Assignee: Force-MOS Technology Corp. (KY)

( * ) Notice: Subject to any disclaimer, the term of this patent is extended or adjusted under 35 U.S.C. 154(b) by 356 days.

(21) Appl. No.: 11/699,256

(22) Filed: Jan. 28, 2007

(65) Prior Publication Data
US 2008/0179662 A1 Jul. 31, 2008

(51) Int. Cl.
*H01L 27/088* (2006.01)
(52) U.S. Cl. .................. 257/401; 257/409; 257/335; 257/E29.297; 257/E21.418; 257/E21.419; 438/140; 438/170
(58) Field of Classification Search .............. 257/401, 257/409, 335–350, E29.257, E29.26, E21.418, 257/E21.419; 438/140, 170, FOR. 230
See application file for complete search history.

(56) References Cited

U.S. PATENT DOCUMENTS

| 5,605,852 | A | * | 2/1997 | Bencuya ............... 438/270 |
| 6,031,265 | A | * | 2/2000 | Hshieh ................. 257/334 |
| 6,825,105 | B2 | * | 11/2004 | Grover et al. .......... 438/570 |
| 6,870,201 | B1 | * | 3/2005 | Deboy et al. ........... 257/170 |
| 7,511,339 | B2 | * | 3/2009 | Mo et al. ............... 257/341 |
| 7,655,975 | B2 | * | 2/2010 | Hirler et al. ........... 257/331 |
| 2004/0021195 | A1 | * | 2/2004 | Kurosaki et al. ....... 257/506 |
| 2004/0113201 | A1 | * | 6/2004 | Bhalla et al. .......... 257/329 |
| 2005/0029585 | A1 | * | 2/2005 | He et al. .............. 257/330 |

* cited by examiner

*Primary Examiner*—Julio J Maldonado
*Assistant Examiner*—Su C Kim
(74) *Attorney, Agent, or Firm*—Bo-In Lin (57) ABSTRACT

A semiconductor power device includes a plurality of closed N-channel MOSFET cells surrounded by trenched gates constituting substantially a square or rectangular cell. The trenched gates are further extended to a gate contact area and having greater width as wider trenched gates for electrically contacting a gate pad wherein the semiconductor power device further includes a source region disposed only in regions near the trenched gates in the closed N-channel MOSFET cells and away from regions near the wider trenched gate whereby a device ruggedness is improved. The source region is further disposed at a distance away from a corner or an edge of the semiconductor power device and away from a termination area. The semiconductor device further includes multiple trenched rings disposed in a termination area opposite the active area and the trenched rings having a floating voltage. The closed N-channel MOSFET cells are further supported on a red phosphorous substrate.

11 Claims, 12 Drawing Sheets

Packing Density
2/(a + b)

Fig. 1C (Prior Art)

Stripe

Packing Density
4a/(a+b)²

Fig. 3A

Closed

CLOSED TRENCH MOSFET WITH FLOATING TRENCH RINGS AS TERMINATION

BACKGROUND OF THE INVENTION

1. Field of the Invention

This invention relates generally to the cell structure, device configuration and fabrication process of power semiconductor devices. More particularly, this invention relates to a novel and improved cell structure, device configuration and improved process for fabricating a trenched semiconductor power device to achieve reduced source to drain resistance Rds, improved device ruggedness and breakdown voltage.

2. Description of the Related Art

As the cell density of the semiconductor power devices increases, there is a greater need to provide configuration such that the source to drain resistance Rsd can be reduced. Meanwhile, in order to provide power devices with broader spectrum of applications, the reduction of Rds, however must be achieved without comprising the device ruggedness and the breakdown voltage. The design and cell configurations to accomplish such requirements become more challenges to those of ordinary skill in the art, particularly when the cell density of the semiconductor power device is increased to a cell density that is above and beyond 600 M/in$^2$ (six hundred million cells per square inch).

Figure 1A:
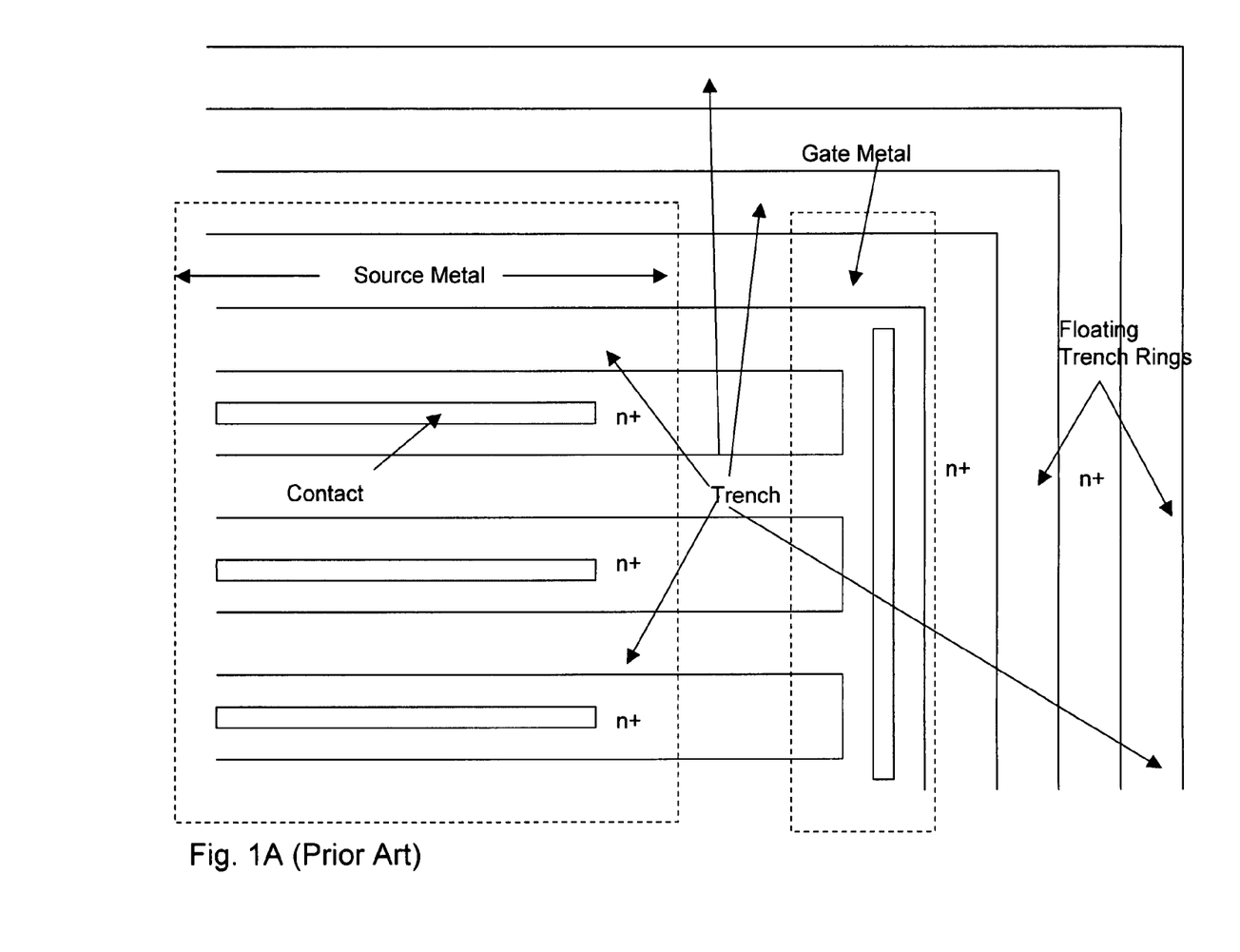
FIGS. 1A and 1B are respectfully a top view and a cross sectional view of a related MOSFET prior art configuration with stripe cell design.
Figure 1B:
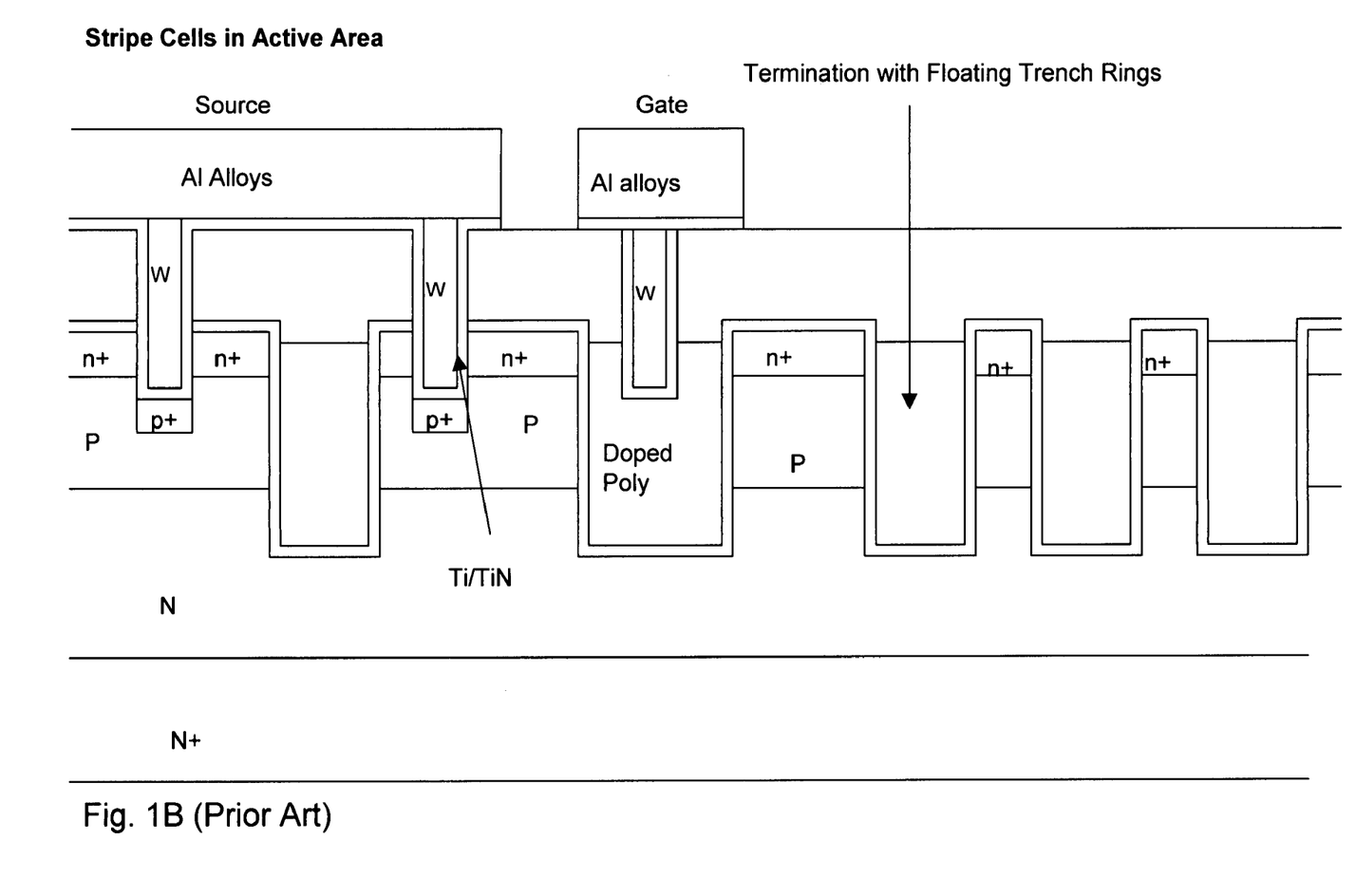

In U.S. Pat. No. 6,462,376 a three-mask process is disclosed to manufacture a DMOS device that has a stripe cell configuration with floating trench ring as termination. FIG. 1 shows a top view and a top view of the device as that disclosed in this patent. The configuration as disclosed however has the disadvantages due to the fact that the stripe cells have higher drain to source resistance (Rds) than the closed cells. Furthermore, the three-mask process allows a n+ region to locate in the termination area and the trench gate area and such configuration degrades the device ruggedness due the fact of additional latch-up of doped zones to become the parasitic N+PN bipolar transistors. When the device turns on, the active cells near the trench gates will be turned on first that can easily trigger the parasitic N+PN to cause potential damages to the device. The corners of the cells are particular vulnerable to such inadvertent triggering-on of the parasitic N+PN transistors due to the higher electrical field around the corner regions of the cells. For this reason, normally a source mask is employed to create a dummy cell that has no N+ region in the cell near the trench gate the device corners. Such techniques are required due the damages found near the device corners during a voltage surge with unclamped inductance switching (UIS) when a device is provided with such dummy cells as damage preventive structures. The disclosures made in this patent have further disadvantages arising from the process flow with the formation of the n+ and P-body before the trench gate formation. A punch-through problem is not preventable for a device with cell density that is higher than 112 million cells per square inch, i.e., as the device pitch is reduced to 2.4 um. The punch through issue arises due to the boron segregation during sacrificial oxidation and gate oxidation. The segregated boron near channel region leads reduction in doping concentration thus increases the likelihood of punch through at the channel region under the condition of reverse bias between drain and source.

Therefore, there is still a need in the art of the semiconductor device fabrication, particularly for trenched power MOSFET design and fabrication, to provide a novel cell structure, device configuration and fabrication process that would resolve these difficulties and design limitations. Specifically, it is desirable to maintain low gate resistance and in the meanwhile, it is further desirable to overcome the problems above discussed difficulties such that further increase of cell density of a trenched semiconductor power device can be achieved.

SUMMARY OF THE PRESENT INVENTION

It is therefore an object of the present invention to provide new and improved semiconductor power device configuration, e.g., a MOSFET device that comprises closed cells. The closed cells are implemented with closed MOSFET cells with each MOSFET cells surrounded by trenched gates with a trenched source body contact disposed in the center to comply with the critical dimension requirement for maintaining a minimum distance between the trenched gates and the source contacts. The source to drain resistance Rds is reduced while the cell density is increased such that the above discussed difficulties and limitations are resolved.

Another aspect of the present invention is configure the MOSFET device with closed MOSFET cell wherein the source regions are disposed at a distance away from the wider trench gate for gate metal contact and from the device corners and edges, and are also disposed away from the termination areas thus the ruggedness of the device is improved.

Another aspect of the present invention is configure the MOSFET device with closed MOSFET cells such that the packing density of the MOSFET cells is further increased when compared with the stripe cell configuration.

Another aspect of the present invention is to further improve the performance of the semiconductor power device by forming the N-channel MOSFET device as closed cells on red Phosphorous doped substrate with resistivity lower than conventional arsenic doped substrate such that the source to drain resistance Rds is further reduced.

Another aspect of the present invention is to further improve the performance of the semiconductor power device by forming the semiconductor power device with multiple floating trench rings in the termination area such that the breakdown voltage in termination area is increased and manufacturing cost is reduced with saving P-body mask.

Another aspect of the present invention is to further improve the performance of the semiconductor power device by forming the body and source regions after the trench gate such that the damages caused by the trench etching processes can be removed and repaired and the punch through problems due to the etching damages on the sidewalls of the trench gate can be prevented.

Briefly, in a preferred embodiment, the present invention discloses a semiconductor power device. The semiconductor power device includes a plurality of closed power transistor cells surrounded by trenched gates constituting substantially a square or rectangular cell the trenched gates further extended to a gate contact area and having greater width as wider trenched gates for electrically contacting a gate pad wherein the semiconductor power device further includes a source region disposed only in regions near the trenched gates in the closed power transistor cells and away from regions near the wider trenched gate whereby a device ruggedness is improved. In an exemplary embodiment, the closed power transistor cells further includes closed N-channel MOSFET cells and the source region further comprising N+ doped source region disposed only in regions near the trenched gates in the closed power transistor cells and away from regions near the wider trenched gate. In another exemplary embodiment, the closed power transistor cells further comprising a body region encompassing the source region wherein the body region is extended near the trenched gate for constituting a current channel controlled by the trenched gates. In another exemplary embodiment, the semiconductor power device further includes an insulation layer overlying the semiconductor device and a plurality of source-body contact trenches opened through the insulation layer extending into the source region and the body region for filling with a source-body contact plug therein for electrically contacting the source region and the body region. In another exemplary embodiment, the semiconductor power device further includes a patterned source metal layer disposed on top of the insulating layer for electrically contacting the source-body contact plug. In another exemplary embodiment, the source region is further disposed at a distance away from a corner or an edge of the semiconductor power device. In another exemplary embodiment, the closed power transistor cells are disposed in an active area and the source region is disposed at a distance away from a termination area opposite the active area. In another exemplary embodiment, the closed power transistor cells are disposed in an active area. The semiconductor power device further includes a trenched ring disposed in a termination area opposite the active area and the trenched ring having a floating voltage. In another exemplary embodiment, the closed power transistor cells are disposed in an active area. The semiconductor power device further includes multiple trenched rings disposed in a termination area opposite the active area and the trenched rings having a floating voltage. In another exemplary embodiment, the closed power transistor cells further comprising closed N-channel MOSFET cells supported on a red phosphorous substrate. In another exemplary embodiment, the semiconductor power device further includes a drain electrode disposed on a bottom surface of a semiconductor substrate supporting the semiconductor power device with the trenched gates and source region disposed near a top surface of the semiconductor substrate opposite the bottom surface.

This invention further discloses a method of manufacturing a semiconductor power device. The method includes a step of forming a plurality of closed power transistor cells each surrounded by trenched gates constituting substantially a square or rectangular shaped cell in an active area and applying a source mask for covering a gate-pad area above wider trenched gates whereby source regions are formed in the closed power transistor cells in the active area and blocked from the gate pad area. In an exemplary embodiment, the step of applying a source mask for implanting a source region further comprising a step of applying the source mask for covering a termination area opposite the active area. In another exemplary embodiment, the step of applying a source mask for implanting a source region further comprising a step of applying the source mask for implanting the source region at a distance away from corners or edges of the semiconductor power device. In another exemplary embodiment, the method further includes a step of disposing a source contact substantially at a center portion of the closed cell by opening a source-body contact trench in an insulation layer covering the closed semiconductor power device and extending the source-body contact trench into a source region below the insulation layer and into a body region below the source region and filling the source body contract trench with a source contact plug. In another exemplary embodiment, the method further includes a step of disposing a source metal layer above the insulation layer to electrically contact the source contact plug. In another exemplary embodiment, the step of forming the plurality of closed power transistor cells comprising a step of forming the closed power transistor cells as closed N-channel MOSFET cells on a red phosphorous substrate. In another exemplary embodiment, the step of forming a plurality of closed power transistor cells by forming the trenched gates surrounding the closed power transistor cells further comprising a step of forming a plurality of trenched rings for connecting to a floating potential whereby a breakdown voltage of the semiconductor power device is improved.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 2A:
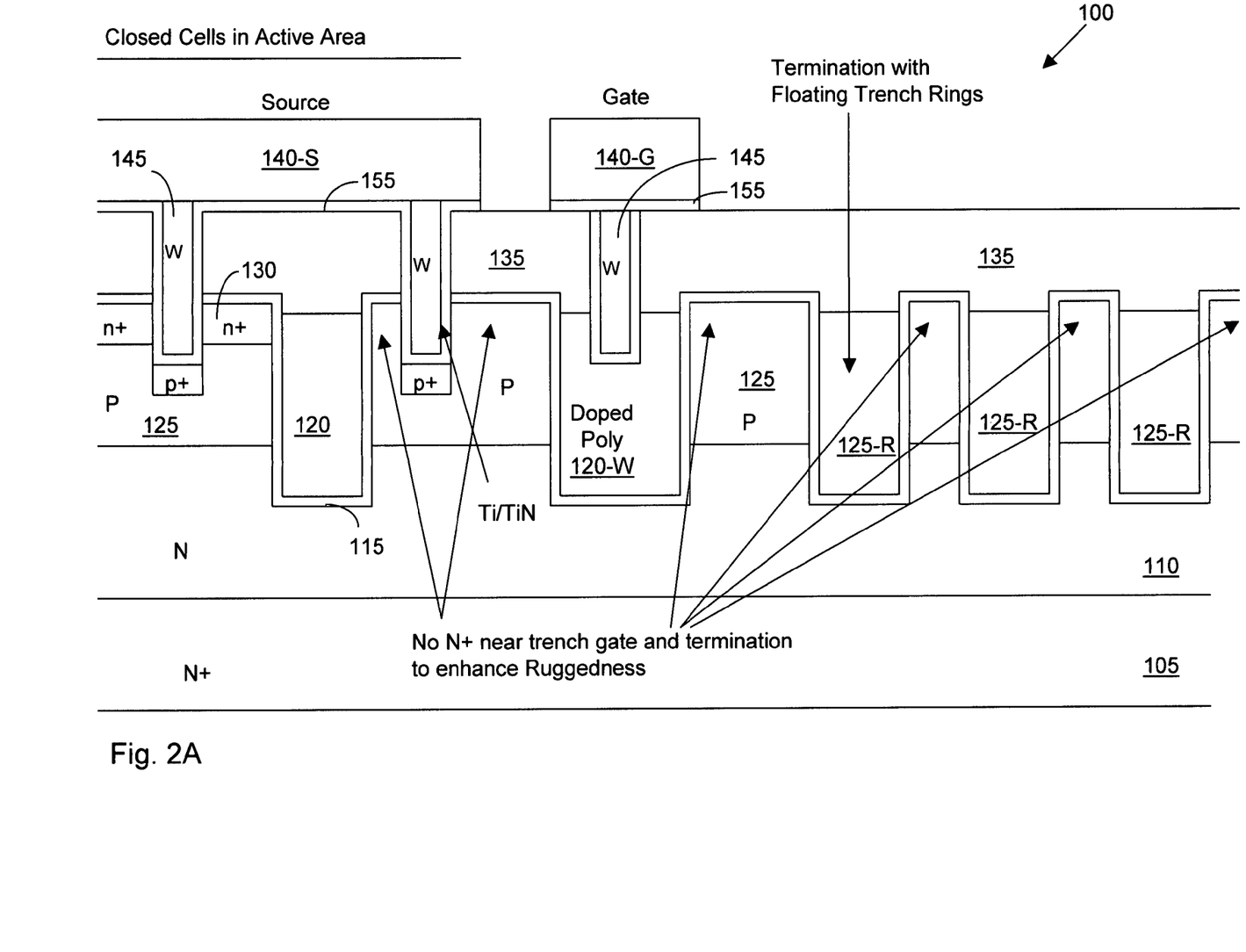
FIGS. 2A and 2B are respectfully a cross sectional view and a top view of a first embodiment for providing a hybrid MOSFET configuration of the present invention.
Figure 2B:
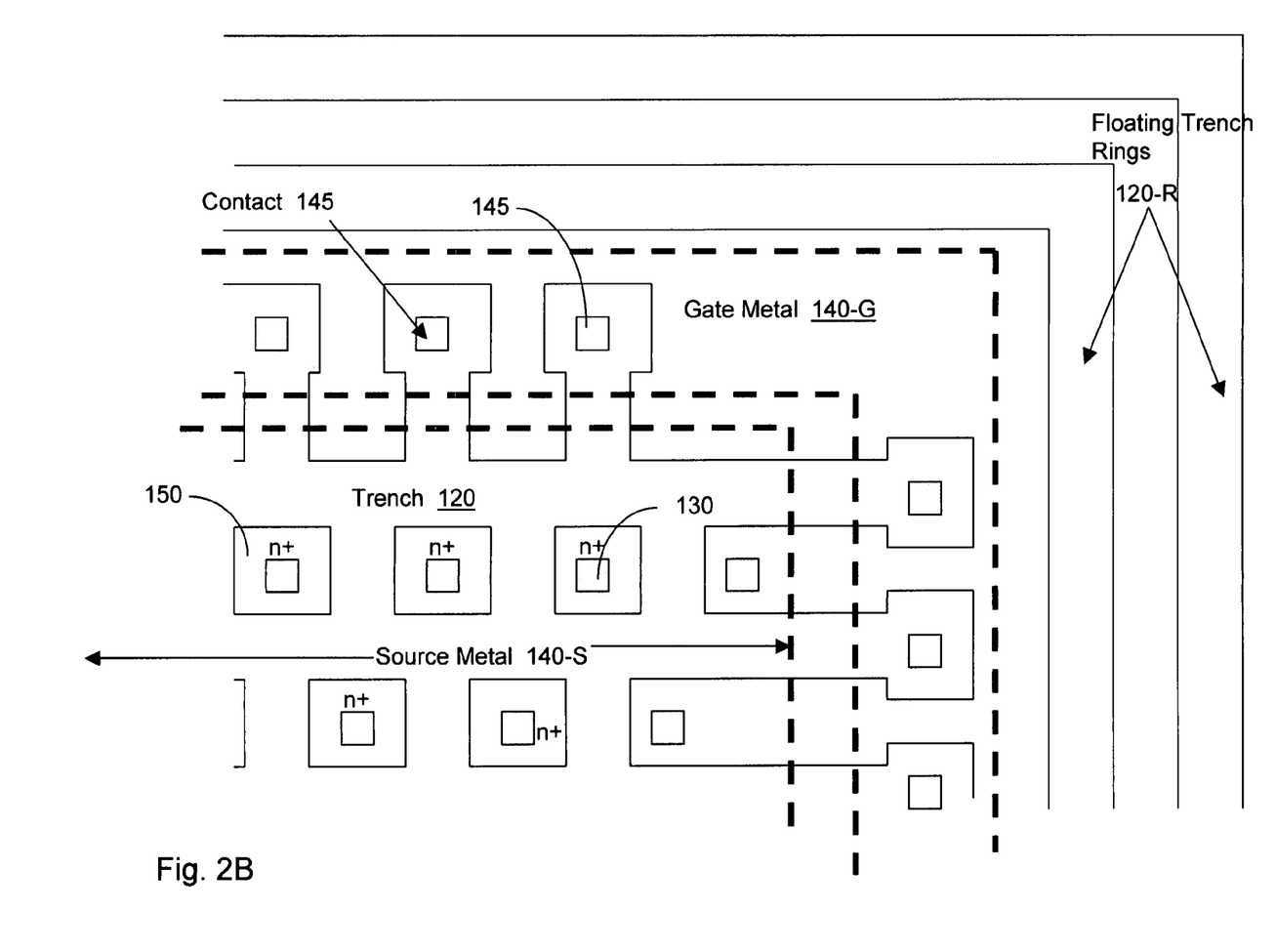

Please refer to FIGS. 2A to 2B for an exemplary embodiment of this invention where a metal oxide semiconductor field effect transistor (MOSFET) device 100 is supported on a substrate 105 formed with an epitaxial layer 110. The MOSFET device 100 includes a trenched gate 120 disposed in a trench with a gate insulation layer 115 formed over the walls of the trench. A body region 125 that is doped with a dopant of second conductivity type, e.g., P-type dopant, extends between the trenched gates 120. The P-body regions 125 encompassing a source region 130 doped with the dopant of first conductivity, e.g., N+ dopant. The source regions 130 are formed near the top surface of the epitaxial layer surrounding the trenched gates 120. The top surface of the semiconductor substrate extending over the top of the trenched gate, the P body regions 125 and the source regions 130 are covered with a NSG and a BPSG protective layers 135. A source metal layer 140-S and gate metal layer 140-G are formed on top of the protective insulation layer 135.

For the purpose of improving the source contact to the source regions 130, a plurality of trenched source contact filled with a tungsten plug 145 that is surrounded by a barrier layer Ti/TiN. The contact trenches are opened through the NSG and BPSG protective layers 135 to contact the source regions 130 and the P-body 125. The source/body trench contacts 145 are in contact with a doped contact region 150 doped with a P+ dopant to enhance the contact of the trenched source-body contacts 145 to the source-body regions. Then a conductive layer 155 with low resistance (not shown) is formed over the top surface to contact the trenched source contact 145. A top contact layer 140 is then formed on top of the source contact 145. The top contact layer 140 is formed with aluminum, aluminum-cooper, AlCuSi, or Ni/Ag, Al/NiAu, AlCu/NiAu or AlCuSi/NiAu as a wire-bonding layer. The low resistance conductive layer 155 is sandwiched between the top wire-bonding layer 140 and the top of the trenched source-plug contact 145 is formed to reduce the resistance by providing greater area of electrical contact. The trenched gates 120 in the active cell area are further extended to gate contact area to have trenches having greater width as wider trenched gate 120-W next to the termination area. A trenched gate contact plug 145 is formed on top of the wider trenched gate to contact the gate pad 140-G. The n+ doped source regions 130 are not formed next to the wider trenched gate 120-W and are not formed in the termination area away from the active cell area to improve the device ruggedness.

Figure 2C:
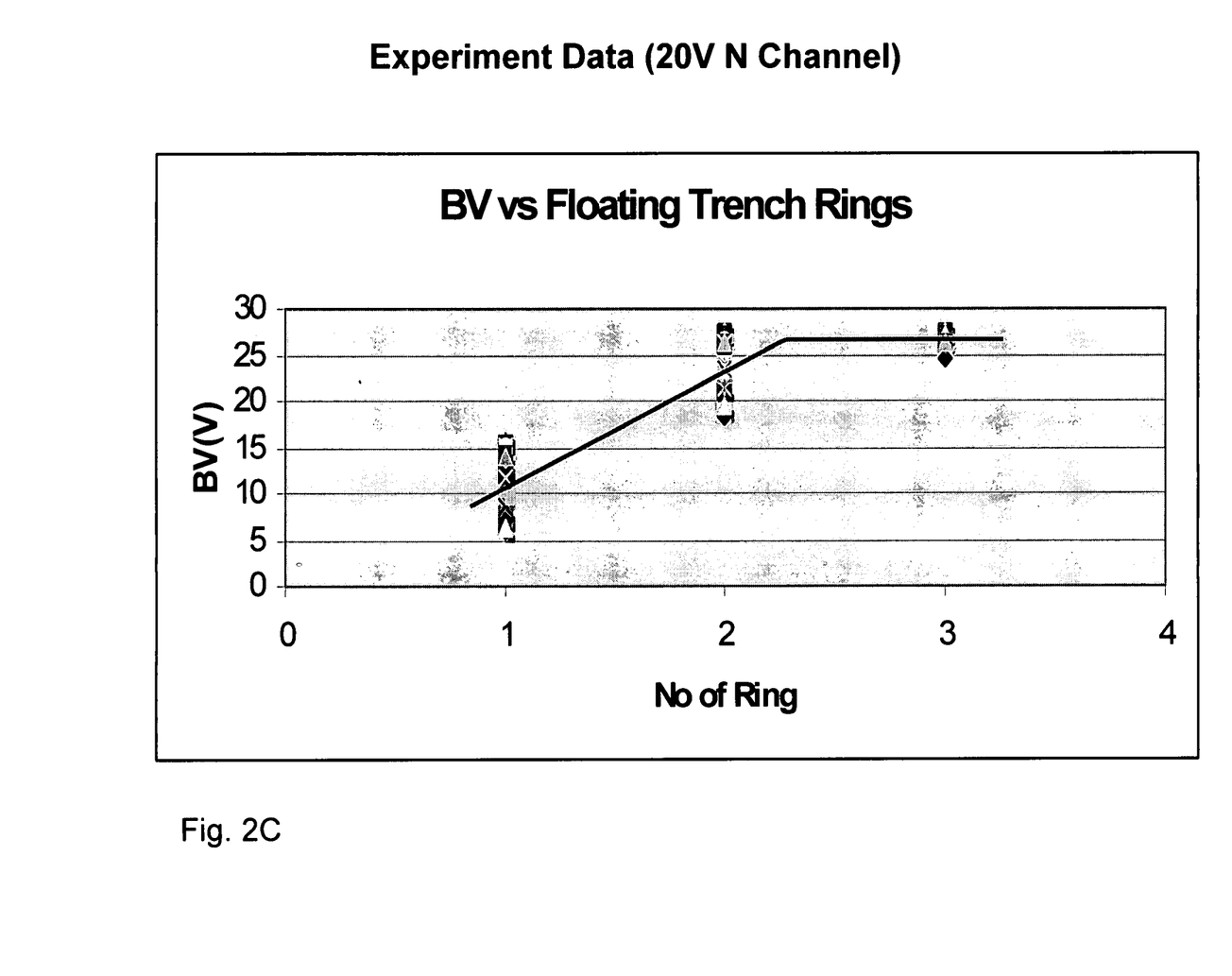
FIG. 2C shows the measurements of the variations of the breakdown voltage versus the number of trenched floating rings in the termination area.

In order to further reduce the source to drain resistance Rds, a close cell configuration is implemented as shown in FIG. 2B. The active area includes a plurality of MOSFET cells configured as closed cells 150 with the trench gate 120 surrounding the cells 150. The N+ regions 130 are now disposed away from the regions next to the wider trenched gates 120-W, away from device corners and edges, and not in the terminal area thus improving the device ruggedness. As shown in FIG. 2C, the breakdown voltage of the device is improved with trench rings 120-R in the termination area with the trench rings 120-R. As will be further described below the device 100 is manufactured with four masks with the P-body regions 125 and the N+ source regions 130 formed after the opening of the trenches, sacrificial and gate oxidations thus the punch through is prevented. Prevention of punch through is achieved because the manufacturing processes significantly prevent the segregation of boron during a diffusion process into the oxides from the mesa near the channel region during the sacrificial and gate oxidation formation. FIG. 2C is a diagram for showing the breakdown voltage (BV) as a function of floating trench rings 120-R. Significant improvement of BV is achieved with two or three floating trench rings as depicted in FIG. 2C wherein each floating ring is applied to sustain about ten volts of reverse biased voltage while the breakdown voltage is demonstrated to be substantially the same as that is provided by the field plate commonly implemented in the conventional semiconductor power devices.

Figure 1C:
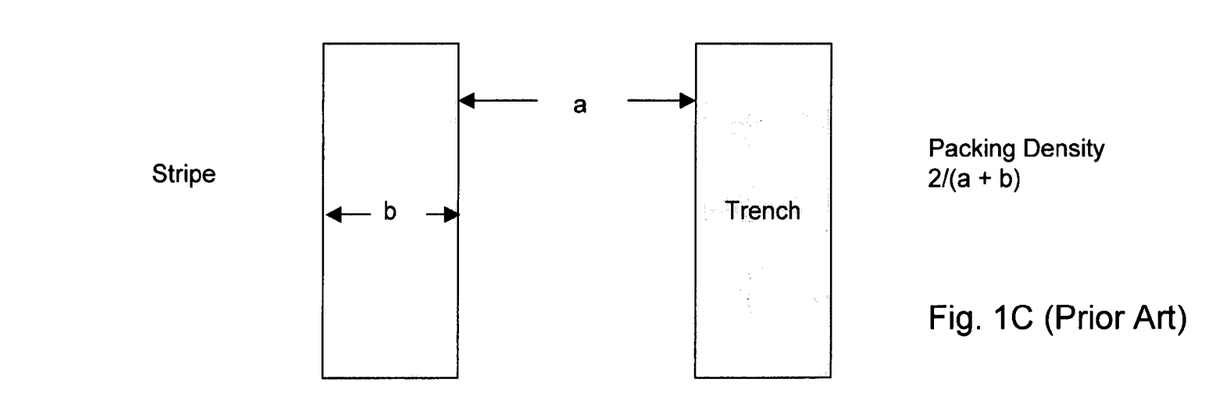
FIG. 1C is a diagram for packing density analysis for a semiconductor power device implemented with stripe cells.
Figure 3A:
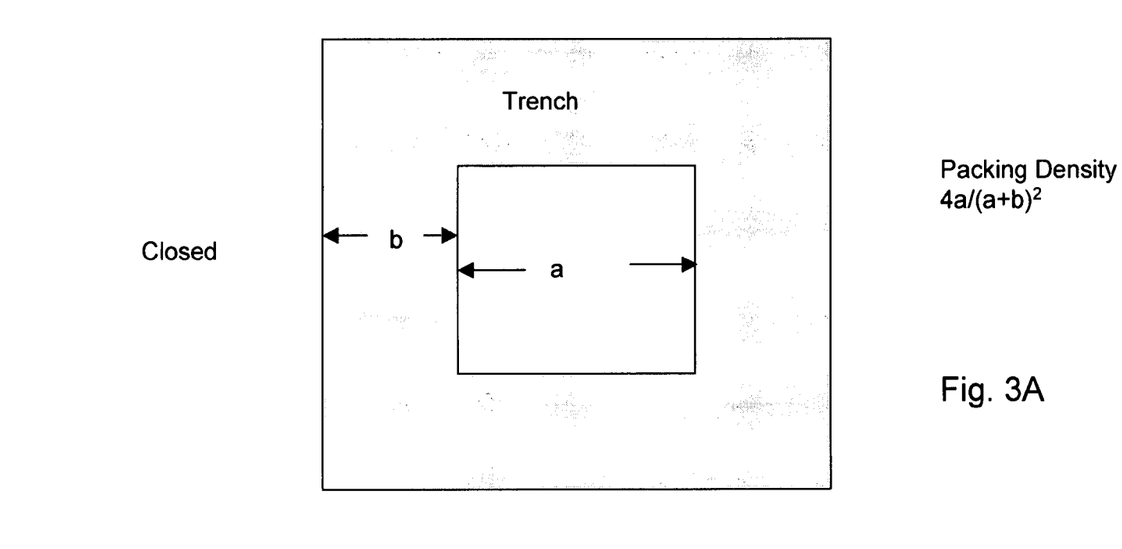
FIG. 3A is a diagram for packing density analysis for a semiconductor power device implemented with closed cell configuration of this invention.
Figure 3B:
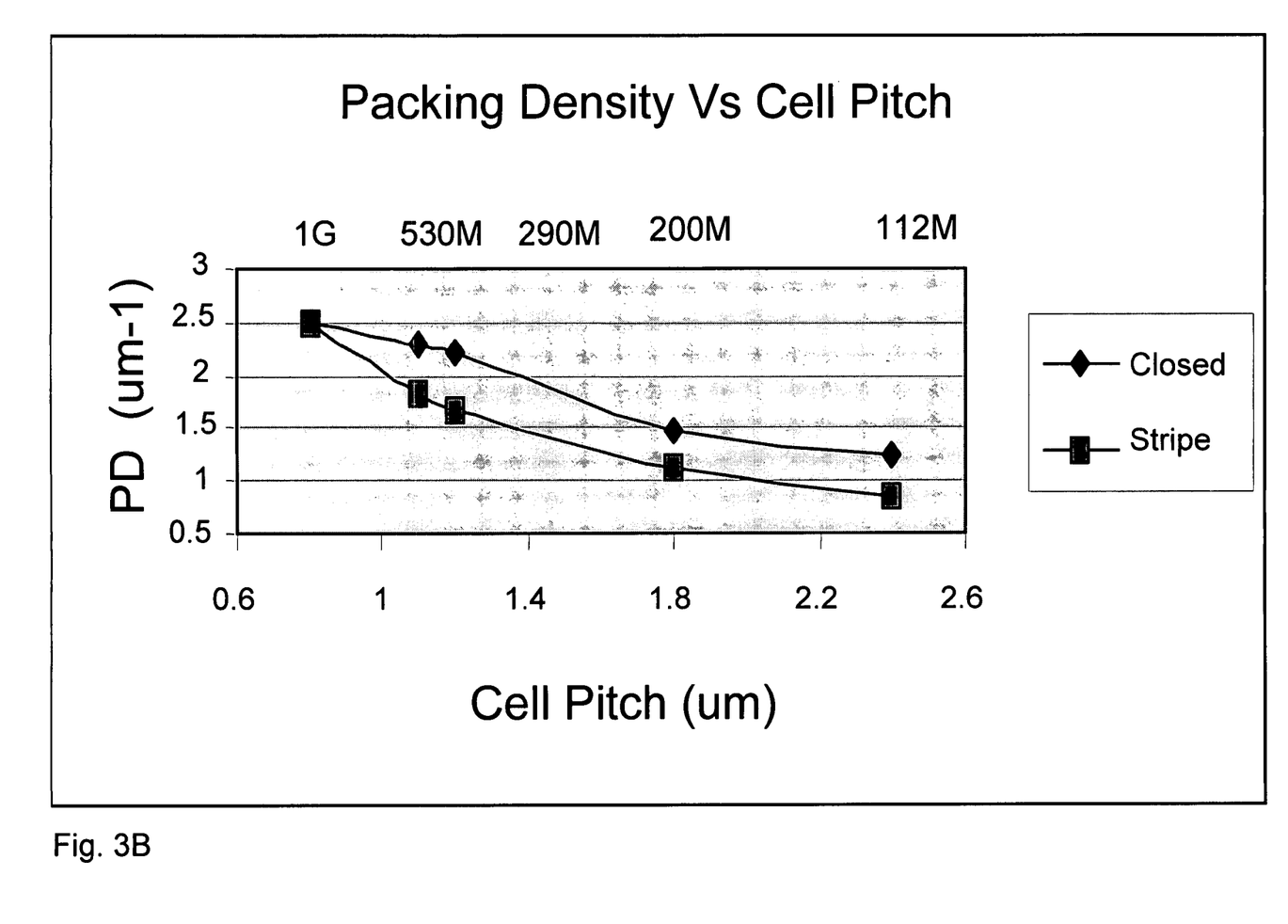
FIG. 3B is a diagram for illustrating and comparing the packing density and cell pitch between the stripe and closed cell configurations.

The closed cell configuration implemented for the semiconductor power device of this invention has another advantage because the cell configurations provide higher packing density and small cell pitch. FIGS. 1C and 3A illustrate analyses of the packing densities of the stripe cells and the closed cells. FIG. 3B further illustrate in a diagram to compare the packing density and cell pitches of the stripe and cell configurations. The analyses and the diagram clearly show that there are improvements of packing density with smaller cell pitch accomplished by the closed cells as disclosed in this invention.

Figure 4A:
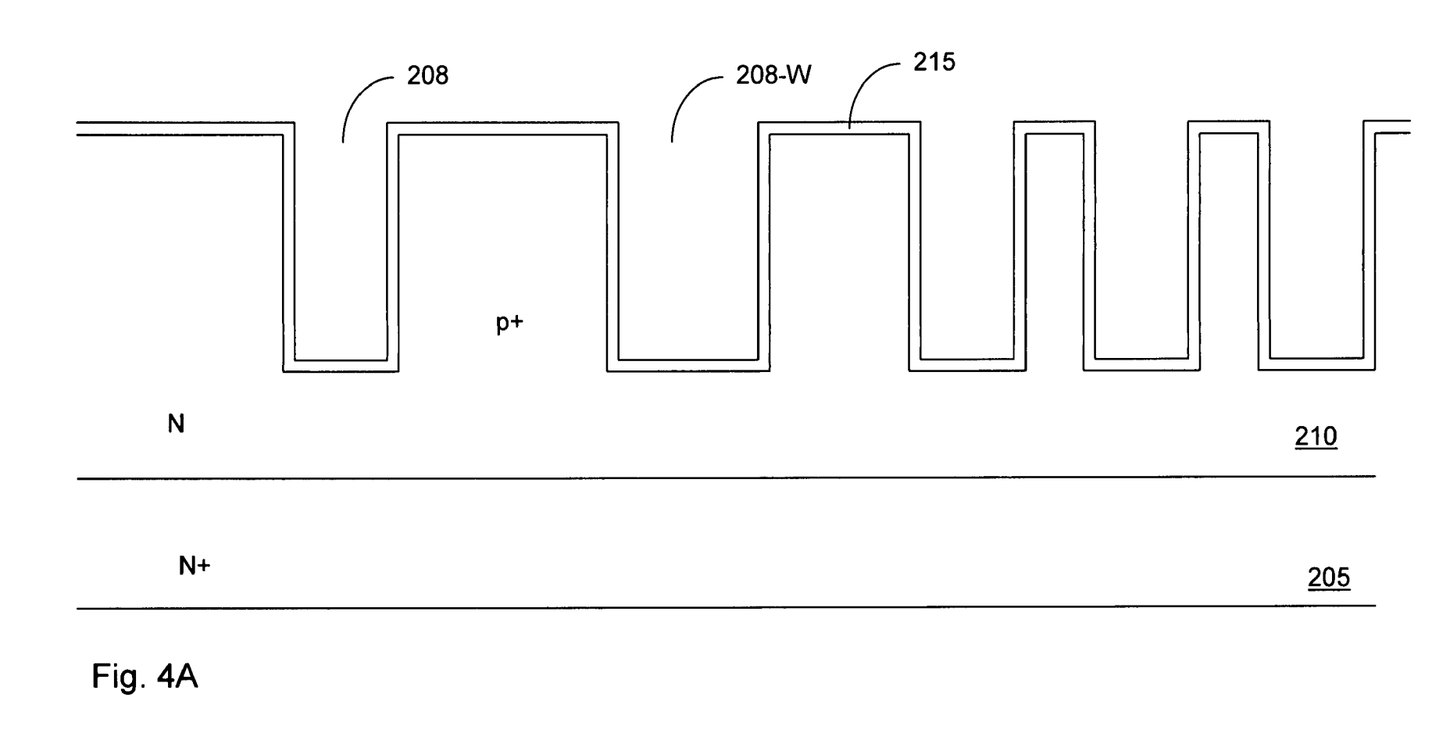
FIGS. 4A to 4E are a serial of side cross sectional views for showing the processing steps for fabricating a MOSFET device as shown in FIGS. 2A to 2B.
Figure 4B:
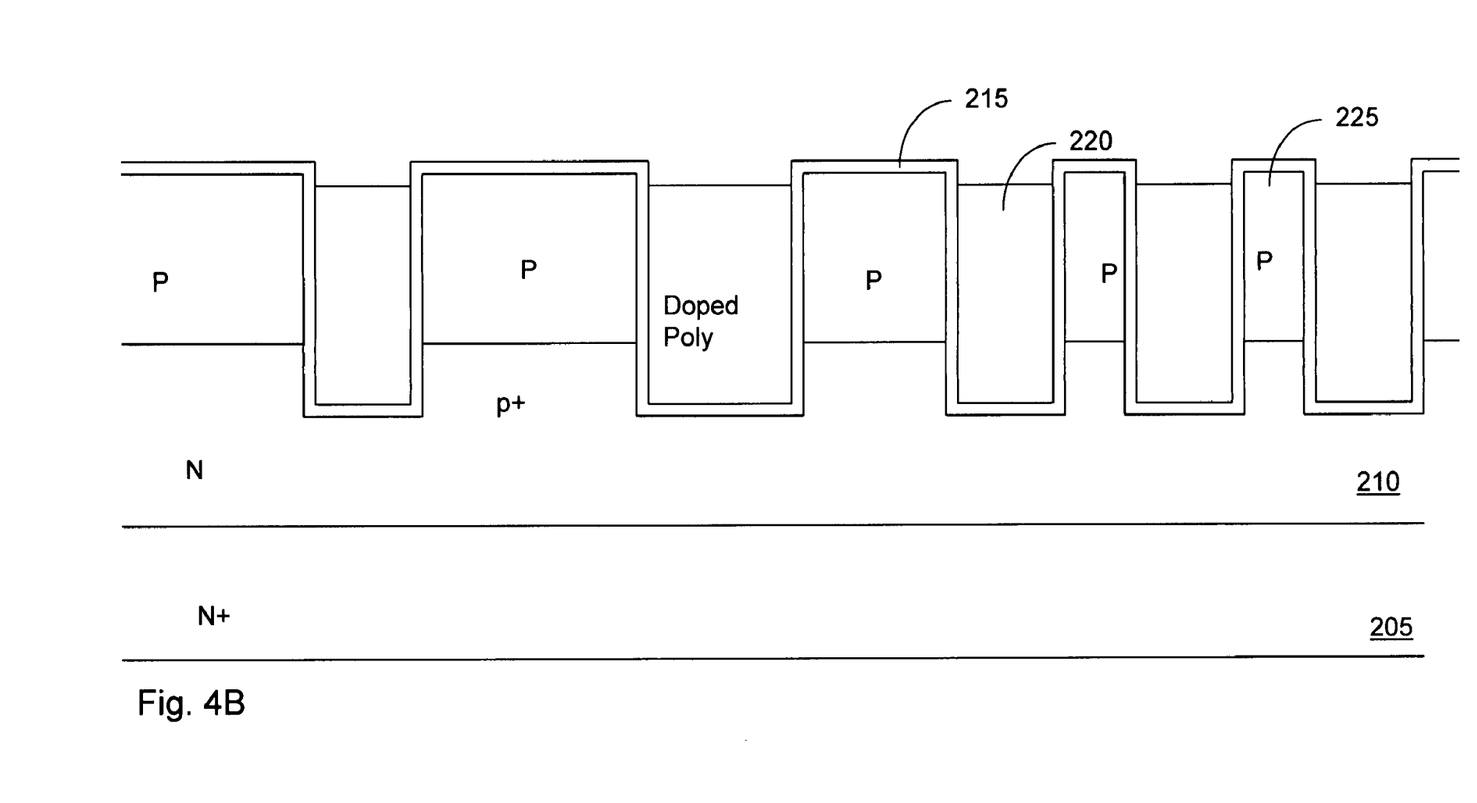
Figure 4C:
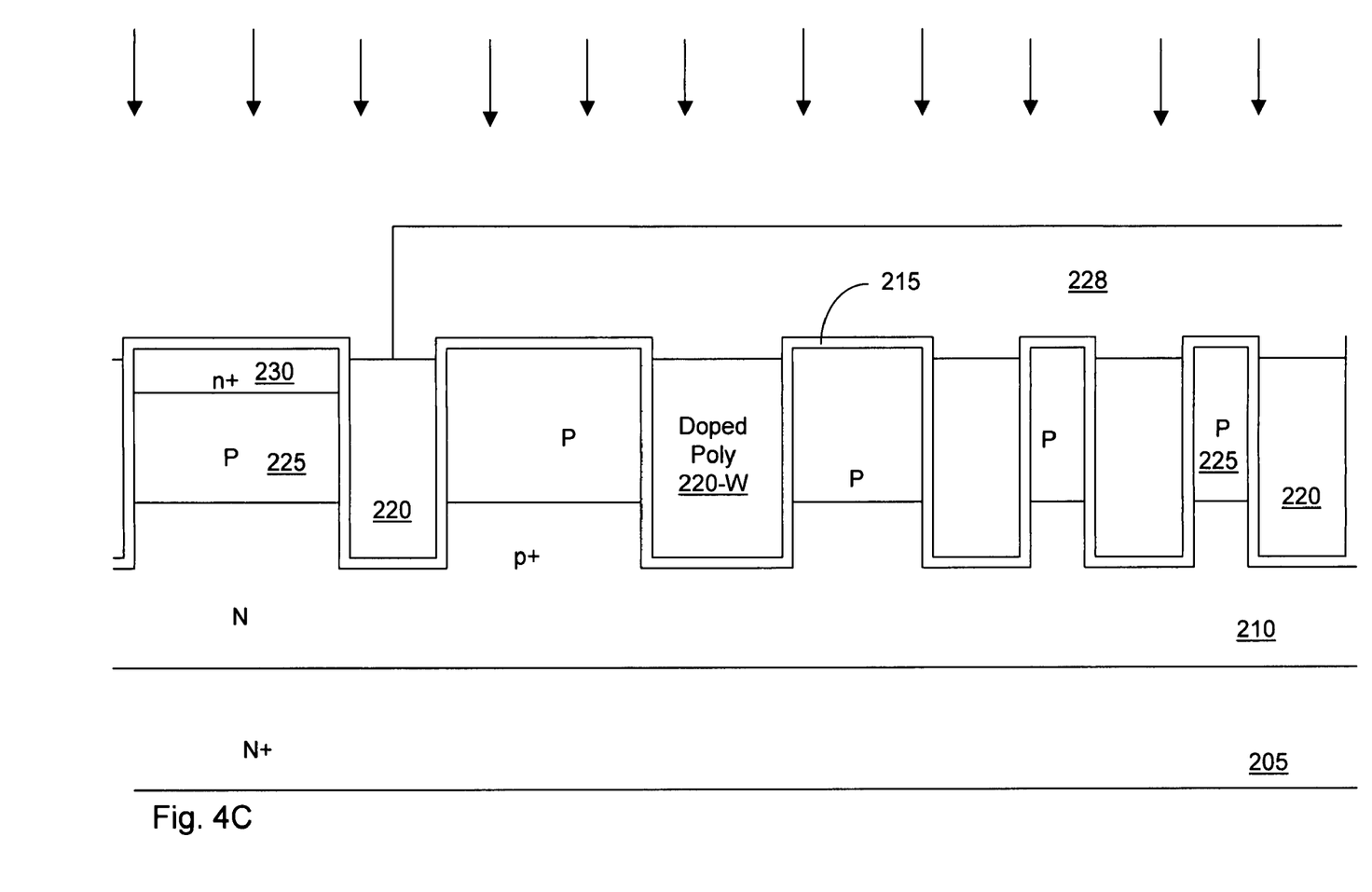

Referring to FIGS. 4A to 4E for a serial of side cross sectional views to illustrate the fabrication steps of a MOSFET device as that shown in FIGS. 2A to 2B. In FIG. 4A, a trench mask (not shown) is applied to open a plurality of trenches 208 in an N epitaxial layer 210 supported on a N+ substrate 205 with wider trenches 208-W near the termination area. In an exemplary embodiment, the substrate is a red phosphorous substrate. The solid solubility of red phosphorous in silicon is higher than arsenic substrate. Lower substrate resistivity is achieved. For the arsenic substrate, maximum resistivity is about 3 mohm-cm while the substrate resistivity of the red phosphorous substrate is about 1.5 mohm-cm or lower. Then a sacrificial oxidation is formed covering the trench walls and removed to remove the plasma damaged silicon layer during the process of opening the trench. The process proceeds with the formation of an oxidation layer 215. In FIG. 4B, a polysilicon layer 220 is filled into the trenches 208 and covering the top surface and then doped with an N+ dopant. The polysilicon layer 220 is etched back. The manufacturing process is followed by a P-body implant with a P-type dopant. Then an elevated temperature is applied to diffuse the P-body 225 into the epitaxial layer 210. In FIG. 4C, a source mask 228 is first applied followed by a source implant with a N-type dopant to form the source region 230.

Figure 4D:
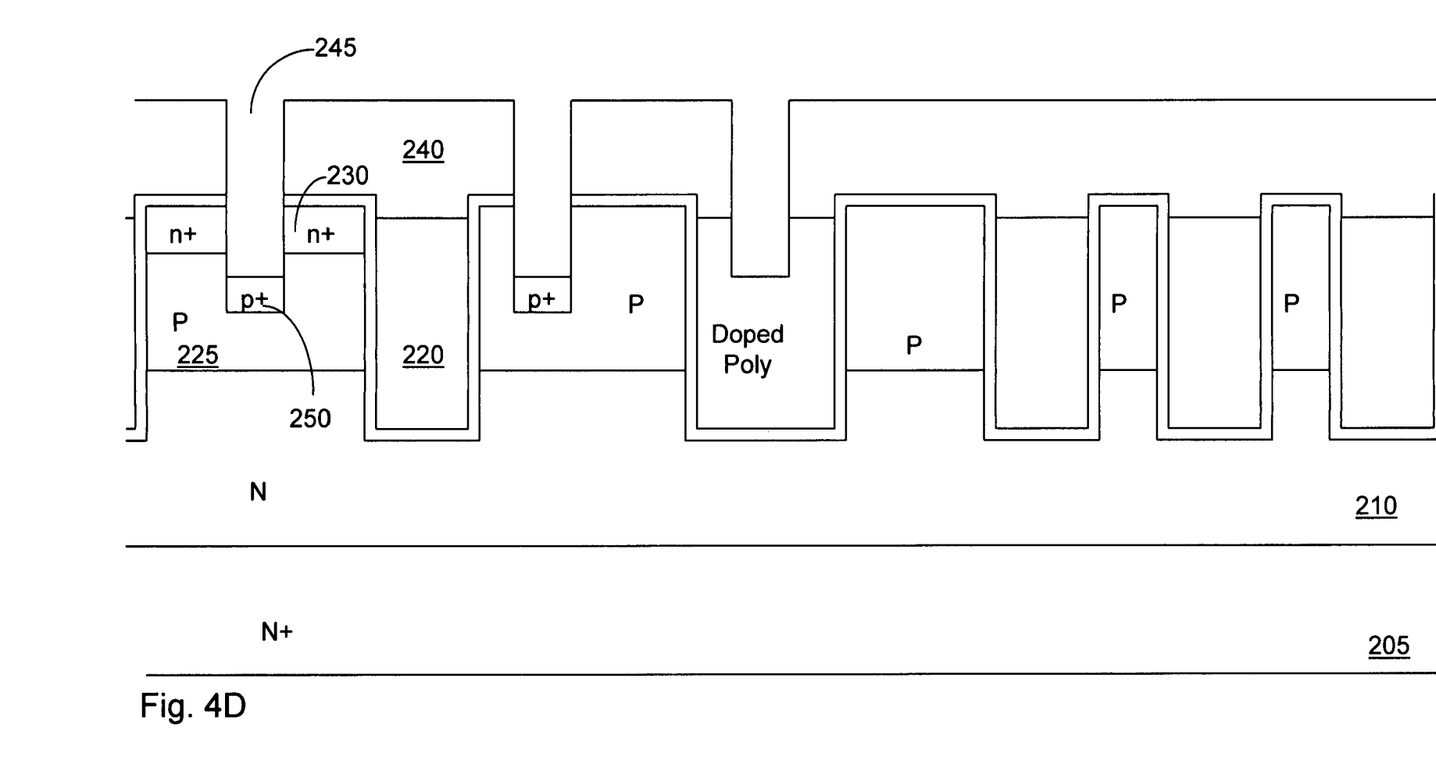
Figure 4E:
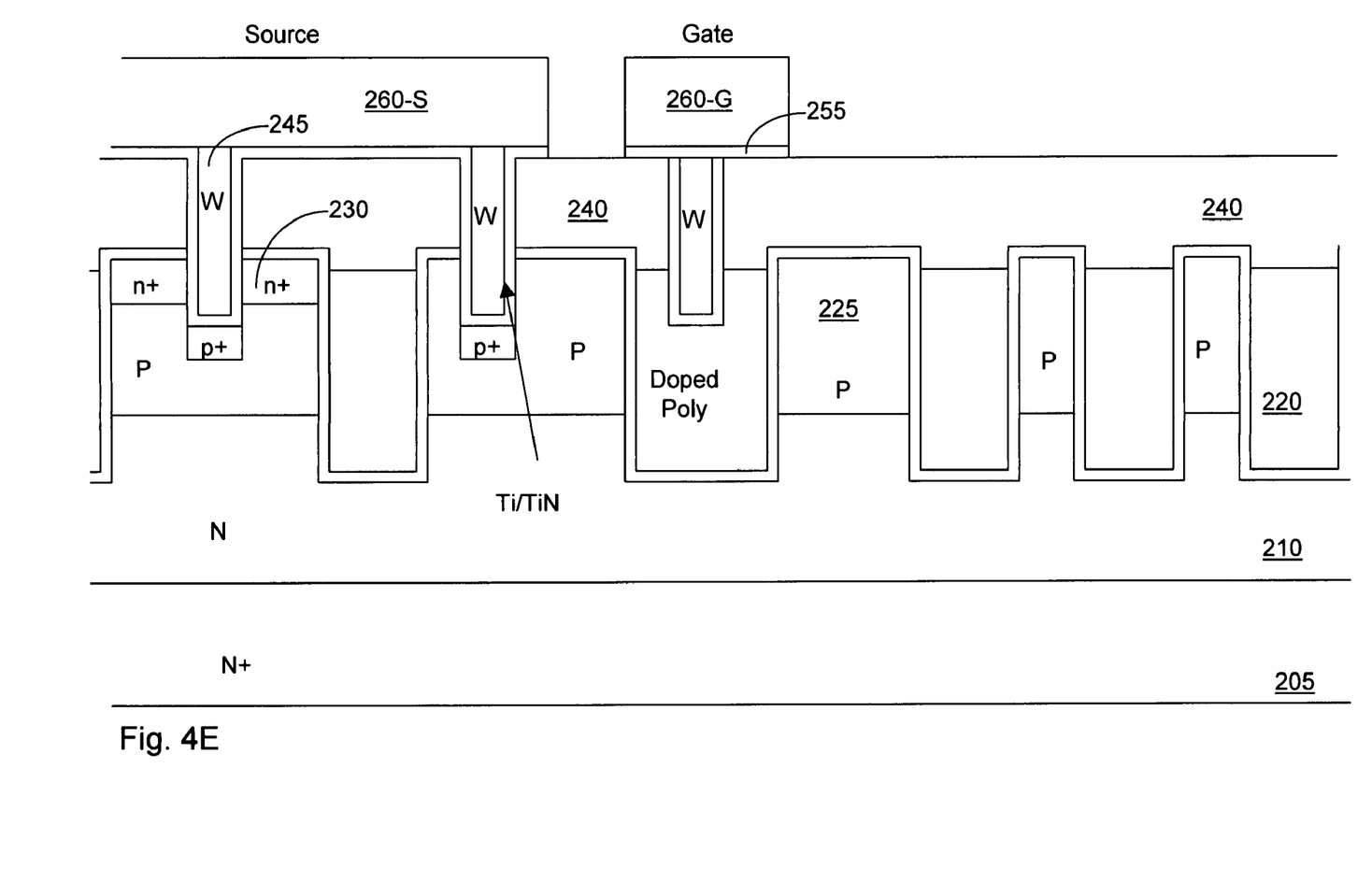

Then an elevated temperature is applied to diffusion the source regions 230. The source mask is applied such that the N+ doped regions 230 are not form next to the wider trenched gate 220-W provided for electrically connecting to the gate pad later. Furthermore, the N+ doped source regions are not formed in the termination area or near the device corners or edges as shown for device ruggedness improvement. In FIG. 4D, the source mask 228 is removed, followed by depositing a non-doped oxide (NSG) layer and a BPSG layer 240 are deposited on the top surface. Then, a contact mask (not shown) is applied to carry out a contact dry etch to open the source-body contact trenches 245 by applying an oxide etch through the BPSG and NSG layers 240 followed by a silicon etch to open the contact openings further deeper into the source regions 230 and the body regions 225. The MOSFET device thus includes a source-body contact trench that has an oxide trench formed by first applying an oxide-etch through the oxide layers, e.g., the BPSG and NSG layers 240. The source-body contact trenches further include a silicon trench formed by applying a silicon-etch following the oxide-etch. The oxide etch and silicon etch may be a dry oxide and silicon etch whereby a critical dimension (CD) of the source-body contact trench is better controlled. Then a BF2 ion implant is performed to form the doped source/body contact region 250 below the bottom of the source/body contact trench 245. In FIG. 4E, the source-body contact trenches are then filled with a Ti/TiN/W layer 245. A low resistance conductive layer 255 is formed on top to cover the oxide layer 240 and also to contact the source body contact layer 245 to increase the current conduction areas to reduce the contact resistance. The low resistance metal layer 255 deposited over the top surface may be composed of Ti or Ti/TiN to assure good electric contact is established. Then a top metal conductive layer 260 composed of Al/Cu is deposited and followed by a metal etch to pattern the metal layer into a source metal pad 260-S and gate pad 260-G.

Therefore, in an exemplary embodiment, this invention discloses a semiconductor power device that includes a plurality of closed N-channel MOSFET cells surrounded by trenched gates constituting substantially a square or rectangular cell. The trenched gates are further extended to a gate contact area and having greater width as wider trenched gates for electrically contacting a gate pad wherein the semiconductor power device further includes a source region disposed only in regions near the trenched gates in the closed N-channel MOSFET cells and away from regions near the wider trenched gate whereby a device ruggedness is improved. The closed power transistor cells further comprising a body region encompassing the source region wherein the body region is extended near the trenched gate for constituting a current channel controlled by the trenched gates. An insulation layer overlying the semiconductor device and a plurality of source-body contact trenches opened through the insulation layer extending into the source region and the body region for filling with a source-body contact plug therein for electrically contacting the source region and the body region. A patterned source metal layer is disposed on top of the insulating layer for electrically contacting the source-body contact plug. The source region is further disposed at a distance away from a corner or an edge of the semiconductor power device and away from a termination area. The semiconductor device further includes multiple trenched rings disposed in a termination area opposite the active area and the trenched rings having a floating voltage. The closed N-channel MOSFET cells are further supported on a red phosphorous substrate.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A semiconductor power device comprising:
a plurality of power transistor cells disposed in an active area near a top surface of an epitaxial layer of first conductivity type grown on a semiconductor substrate of said first conductivity type wherein each of said transistor cells is surrounded by trenched gates;
multiple trenched floating rings disposed in a termination area surrounding said active area and each of said trenched floating rings filled with a doped polysilicon layer of said first conductivity type padded by a gate insulation layer in a trench having a floating voltage wherein said trenched floating rings further penetrating through a body region and extending into said epitaxial layer;
said body region of a second conductivity type formed in both said active cell area and said termination area disposed immediately adjacent to said trenched floating rings;
said trenched gates further extended to a gate contact area having a greater width than said trench gates in said active cell area as wider trenched gates for electrically contacting a gate pad; and
a source region of said first conductivity type disposed only in said active area but not in said termination area comprising said multiple trenched floating rings and no source regions disposed in said epitaxial layer regions adjacent to said wider trenched gate in said gate contact area.

2. The semiconductor power device of claim 1 wherein:
said power transistor cells further comprising N-channel MOSFET cells and said source region further comprising N+ doped source region disposed only in said active area but not in said termination area comprising said multiple trenched floating rings filled with an N+ doped polysilicon layer padded with said gate insulation layer and no N+ dopant regions disposed in said epitaxial layer adjacent to said wider trenched gate in said gate contact area.

3. The semiconductor power device of claim 1 wherein:
said power transistor cells further comprising P-channel MOSFET cells and said source region further comprising P+ doped source region disposed only in said active area but not in said termination area comprising said multiple trenched floating rings filled with a P+ doped polysilicon layer padded with said gate insulation layer and no P+ dopant regions disposed in said epitaxial layer adjacent to said wider trenched gate in said gate contact area.

4. The semiconductor power device of claim 1 further comprising:
an insulation layer overlying said semiconductor device and a plurality of source-body contact opened through said insulation layer and said source region and extending into said body region for filling with a source-body contact plug therein for electrically contacting said source region and said body region; and
a plurality of gate contact opened through said insulating layer and extending into said wider trenched gates wider than said trench gates in said active cell area for filling with a gate-contact metal plug therein for electrically contacting said wide trenched gate disposed in said epitaxial layer having no source regions adjacent to said wider trenched gate.

5. The semiconductor power device of claim 4 further comprising:
a patterned source metal layer and a patterned gate pad disposed on top of said insulating layer for electrically contacting said source-body contact plug and said gate-contact plugs respectively.

6. The semiconductor power device of claim 1 wherein:
said multiple trenched floating rings in said termination comprising at least three trenched rings.

7. The semiconductor power device of claim 1 wherein:
said multiple trenched floating rings in said termination having equal space between one another.

8. The semiconductor power device of claim 1 wherein:
said power transistor cells further comprising N-channel MOSFET cells disposed near the top surface of said epitaxial layer supported on a red phosphorous substrate.

9. The semiconductor power device of claim 1 further comprising
a drain electrode disposed on a bottom surface of a said semiconductor substrate supporting said semiconductor power device with said trenched gates and source region disposed near the top surface of said epitaxial layer.

10. A semiconductor power device comprising:
a plurality of N channel or P-channel MOSFET cells surrounded by trenched gates in an active area near a top surface of an epitaxial layer of first conductivity grown on a substrate of first conductivity type;
said trenched gates further extended to a gate contact area and having greater width as wider trenched gates than said trench gates in said active cell area for electrically contacting a gate pad;
at least three trenched floating rings disposed in a termination area surrounding said active cell area and said trenched floating rings filled with a doped polysilicon layer of said first conductivity type padded by a gate insulation layer in a trench having a floating voltage wherein said trenched floating rings penetrating through a body region and extending into said epitaxial layer;
said body region of a second conductivity type formed in both said active cell area and said termination area disposed immediately adjacent to said trenched floating rings;
a source region of said first conductivity type disposed only in said active area but not in said termination area having said multiple trenched floating rings and no source regions disposed in said epitaxial layer adjacent to said wider trenched gate in said gate contact area;
an insulation layer overlying said semiconductor device and a plurality of source-body contact trenches opened through said insulation layer and said source region and extending into said body region for filling with a source-body contact metal plug therein for electrically contacting said source region and said body region;
a patterned source metal layer disposed on top of said insulating layer for electrically contacting said source-body contact plug; and
a drain electrode disposed on a bottom surface of a semiconductor substrate supporting said semiconductor power device.

11. The semiconductor power device of claim 10 wherein:
said N-channel MOSFET cells are disposed near top surface of said epitaxial layer supported on a red phosphorous substrate.

* * * * *